US005252498A

United States Patent [19]

Yamazaki

[11] Patent Number: 5,252,498

[45] **Date of Patent: * Oct. 12, 1993**

[54] METHOD OF FORMING ELECTRONIC DEVICES UTILIZING DIAMOND

[75] Inventor: Shunpei Yamazaki, Tokyo, Japan

[73] Assignee: Semiconductor Energy Laboratory Co., Ltd., Kanagawa, Japan

[*] Notice: The portion of the term of this patent subsequent to Feb. 18, 2009 has been disclaimed.

[21] Appl. No.: 775,498

[22] Filed: Oct. 15, 1991

Related U.S. Application Data

[62] Division of Ser. No. 571,265, Aug. 23, 1990, Pat. No. 5,089,802.

[30] Foreign Application Priority Data

Aug. 28, 1989 [JP] Japan ................................ 1-221215
Aug. 28, 1989 [JP] Japan ................................ 1-221216

[51] Int. Cl.[5] ........................................ H01L 21/265

[52] U.S. Cl. ...................................... 437/20; 437/918; 437/942; 148/33.4

[58] Field of Search ................. 437/20, 100, 918, 942; 338/22 SD; 156/DIG. 68; 148/33.4, DIG. 136

[56] References Cited

U.S. PATENT DOCUMENTS 4,151,008 4/1979 Kirkpatrick ......................... 437/942
4,350,537 9/1982 Young et al. ........................ 437/942
4,806,900 2/1989 Fujimori et al. ............... 338/225 D
4,863,529 9/1989 Imai et al. .......................... 148/33.4
5,051,785 9/1991 Beetz, Jr. et al. .......... 156/DIG. 68
5,089,802 2/1992 Yamazaki ....................... 338/22 SD

*Primary Examiner*—Brian E. Hearn
*Assistant Examiner*—C. Chaudhari
*Attorney, Agent, or Firm*—Sixbey, Friedman, Leedom & Ferguson

[57] ABSTRACT

A diamond thermistor is described. Surface portions of temperature sensing diamond of the thermistor are doped with impurity ions by ion implantation except for a sensing area thereof. A pair of electrodes are formed on the pairs of impurity regions in order to make good ohmic contacts with the diamond. The damage caused by the ion implantation is remedied by subjecting the diamond film to laser annealing.

22 Claims, 4 Drawing Sheets

METHOD OF FORMING ELECTRONIC DEVICES UTILIZING DIAMOND

This is a divisional application of Ser. No. 07/571,265, filed Aug. 23, 1990, now U.S. Pat. No. 5,089,802.

BACKGROUND OF THE INVENTION

1. Field of the Invention

The present invention relates to diamond devices, more particularly to diamond thermistors having high temperature coefficients, and manufacturing methods for the same.

2. Description of the Prior Art

There are two types of thermistors, i.e. PTC (positive temperature coefficient) devices and NTC (negative temperature coefficient) devices. The former are made of barium titanate and the later of silicon carbide for example. The temperature range in which these conventional devices can operate is not so wide and their response speed to temperature change is not so high. A need therefore exists for thermistors to have quick response over a wide temperature range.

On the other hand, diamond electric devices have recently attracted reseacher's interest. Some attempts have been made to form thermistors by the use of diamond as a thermally sensitive material. The prior art diamond thermistors have small thermistor coefficients and require relatively high voltages to be applied thereacross. The inventor carefully investigated the thermal characteristics of the prior art thermistors. The thermistor coefficients B thereof were measured to be about 7000 (activation energy=0.6V) when the diamond was not given intentional doping such as, boron. The resistance at the contact between the diamond and an electrode, however, was very high. Because of this, it was very difficult to control the distance between electrodes and a relatively high voltage is needed to drive the prior art device and the characteristics of devices were substantially dispersed.

A good ohmic low resistant contact can be obtained when boron is introduced into the diamond. The thermistor coefficient B of the device, however, is lowered to be about 2000 (activation energy=0.21 eV) in case of 300 ppm doping of boron.

SUMMARY OF THE INVENTION

It is an object of the present invention to provide a diamond thermistor consisting of a temperature sensing diamond film having a high thermistor coefficient.

It is another object of the present invention to provide a method of producing a diamond thermistor consisting of a temperature sensing diamond film having a high thermistor coefficient.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

In order to accomplish the foregoing and other objects and advantages, it is proposed to form contact regions having low resistivity within or on a diamond film in order to make a good electric contact with electrodes. The contact regions are formed by ion implantation only into a pair of surface areas on which electrodes are deposited to form the output terminals of a thermistor. The ion implanted regions are then laser annealed to cure damage caused by the ion implantation. The laser annealing is carried out in a vacuum or in an inert gas at liquid nitrogen temperature ~ room temperature ~ 700° C. With this structure, the sensitivity and response speed to temperature change are significantly improved. Namely, the transition time required to follow change from one condition at a first temperature to another condition at a second temperature is of the order of 3 seconds or shorter. Also, 6000 or higher thermistor coefficients are achieved.

When the present invention is applied to a planar thermistor, temperatures of gases or liquids can be effectively sensed. When the present invention is applied to a plateau-type thermistor, temperatures of solid state objects can be effectively sensed. Diamond for forming the impurity regions therein can be a single crystalline diamond, a diamond film or a crystalline diamond formed on a semiconductor substrate such as a Si substrate, or a diamond film or granular diamond having a plateau formed on a ceramic or silicon nitride substrate. For example, intrinsic diamond is provided and impurity regions are formed by ion implantation into part of the diamond. During the ion implantation, the impurity regions become damaged regions (amorphous regions or regions partially comprising an amorphous or graphite component). The damage is cured by laser annealing.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1A:
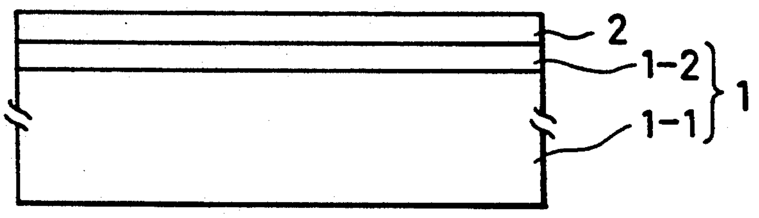
FIGS. 1(A) to 1(C) are cross sectional views showing a method of manufacturing diamond thermistors in accordance with a first embodiment of the present invention.
Figure 1B:
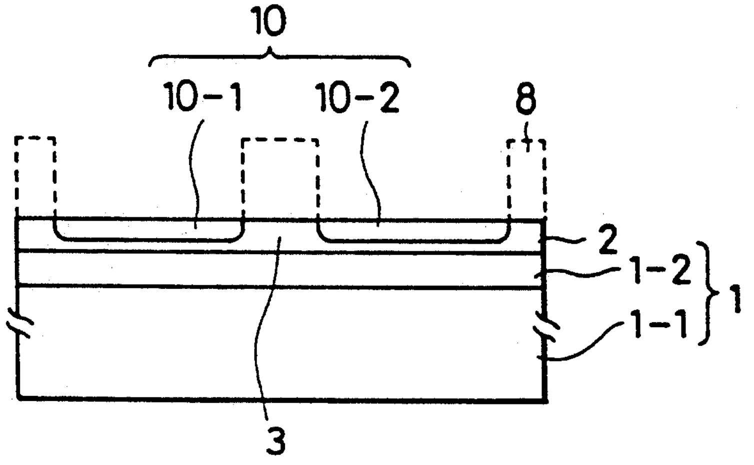
Figure 1C:
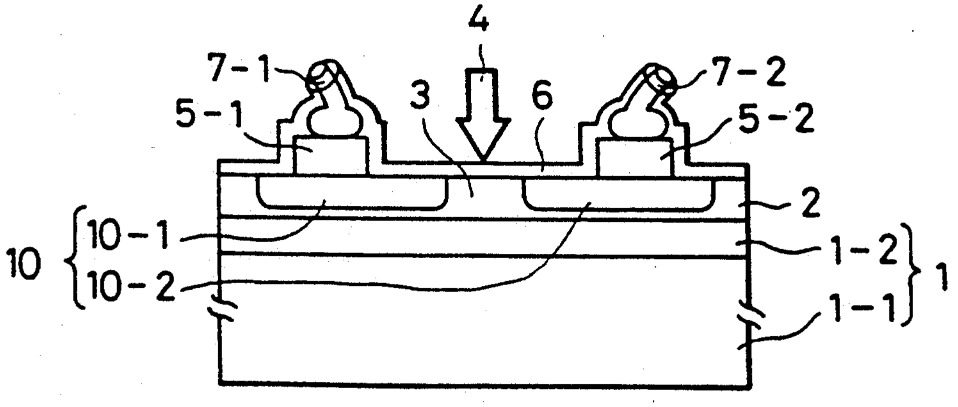

FIG. 1 shows elevational views, in cross section, of the successive steps of manufacture of a diamond thermistor in accordance with a first embodiment of the present invention.

A silicon nitride film 1-2 of 0.5 micrometer thickness is deposited on a single crystalling silicon semiconductor substrate 1-1 by a known CVD method to form an appropriate substrate for thermistor. The melting point of the silicon nitride film is 1700° C. and therefore the reaction between the silicon substrate and a diamond film to be deposited thereon is prevented in the following process. On the silicon nitride film 1-2 a diamond film 2 is deposited to an average thickness of 1.3 micrometers as a substantially intrinsic semiconductor film as shown in FIG. 1(A). The diamond film 2 may be doped, if desired, with boron at a limited density of no higher than $1\times10^{17}$ $cm^3$ or with Zn, P, N, As, S, O, Se or the like at $1\times10^{15}$ to $1\times10^{17}$ $cm^2$. The deposition process will be carried out in an apparatus illustrated in FIG. 2, which will be explained later in details.

A photoresist film 8 of 3 micrometer thickness is coated on the diamond film 2 and patterned to cover selected portions of the surface thereof. With the photoresist film 8 as a mask, the diamond film 2 is doped with boron to a relatively high density of $5\times10^{17}$ to $5\times10^{20}$ $cm^{-3}$ by ion implantation at an acceleration voltage of 20 to 300 KeV to form p-type impurity semiconductor regions 10-1 and 10-2. An element selected from Group IIa, IIb, IIIa, IVa, Va and VIa of the periodic table may be used in place of the dopant of boron. A silicon nitride film may be interposed as a protecting film, if necessary, between the diamond film 2 and the photoresist film 8. After removing the mask 8, the substrate 1 is disposed in an apparatus illustrated in FIG. 3 and subjected to laser annealing in order to cure imperfection caused by the ion implantation to form impurity semiconductor 10 of p-type conductivity. Thus, junctions (so called here because they are necessarily PN junctions) can be formed as designated by 10-1 in FIG. 1. The process of the laser annealing will be explained later in details.

A pair of electrodes 5-1 and 5-2 are formed on the p-type regions 10-1 and 10-2 by vapor evaporation or sputtering. The electrodes are made of a dual film consisting of a lower titanium or tungsten film and an upper aluminum film with which wire bonding can be made easily. Lead wirings 7-1 and 7-2 are bonded to the electrode 5-1 and 5-2. Finally, a silicon nitride film 6 is coated to a thickness of 500 to 5000 angstroms on the whole surface of the structure for antireflection, passivation and oxidation-proof. The coating is particularly effective when the thermistor is used at 500° C. or higher temperatures. Then, the formation of a planar thermistor has been completed with an electric current path consisting of the electrode 5-1, the impurity semiconductor region 10-1 of a p-type conductivity, the temperature sensing region 3 of substantially intrinsic semiconductor, the other p-type semiconductor region 10-2 and the other electrode 5-2.

Figure 4:
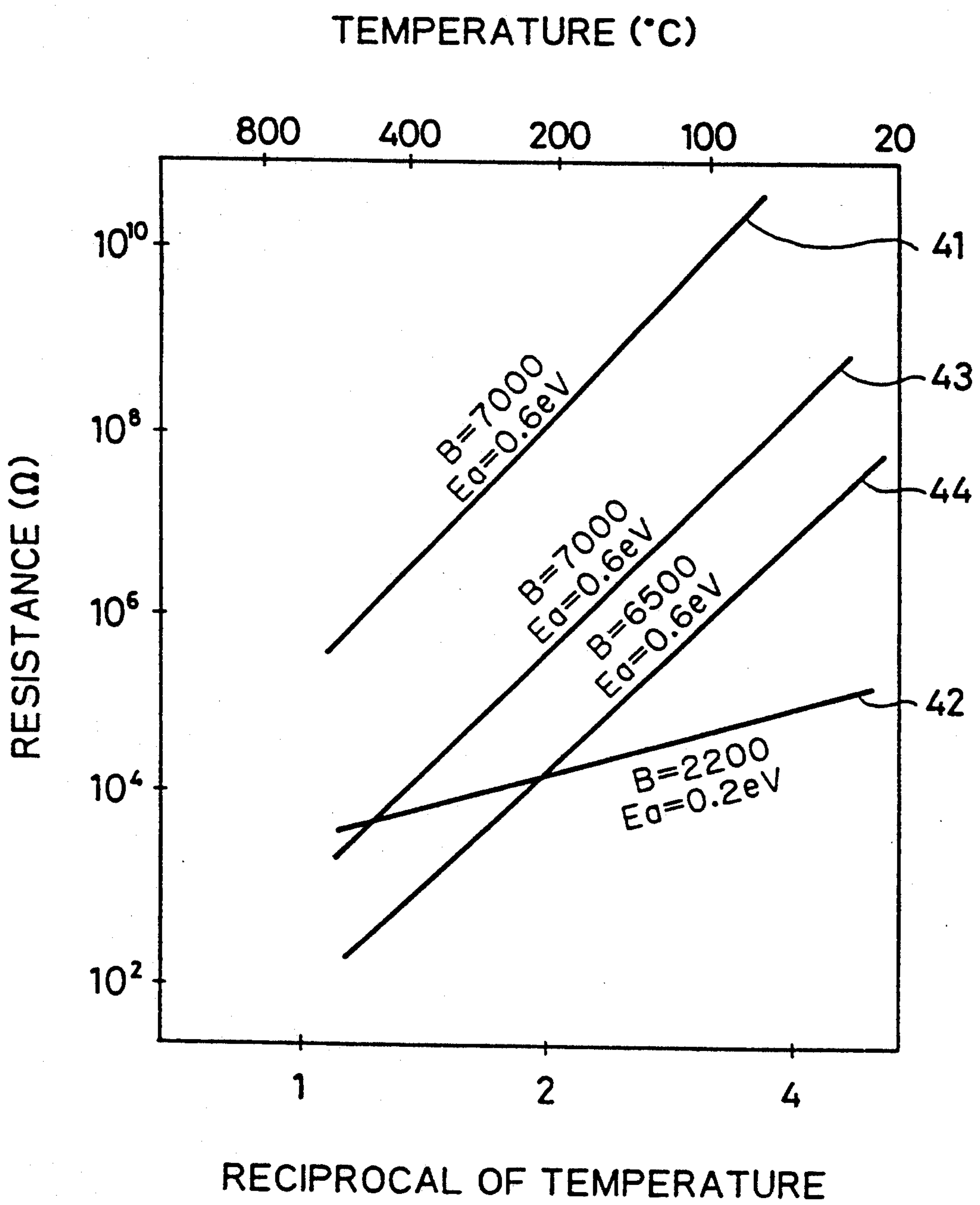
FIG. 4 is a graphical representation showing temperatureresistance characteristics of thermistors.

FIG. 4 illustrates the resistances of thermistors as functions of the reciprocal of temperature. Line 41 represents the characteristic of a thermistor formed in accordance with the above process but no intentional dose of any impurity was introduced into the diamond film 2. The distance between the pair of electrodes 5-1 and 5-2 was 5 mm. The thermistor constant was measured to be 7000 and the activation energy to be 0.6 eV. The voltage applied between the electrodes was relatively high as 70 to 250 V because of the relatively wide distance. Line 42 represents the resistance of a thermistor formed according to the above process with intentional doping of boron ions at 300 ppm into the whole diamond film 2 including the temperature sensing diamond region 3. While the good ohmic contacts were made at the electrodes 5-1 and 5-2, the thermistor constant was so small as 2200. Lines 43 and 44 represent the resistances of thermistors formed in accordance with the above process in which no intentional dose of any impurity was introduced into the temperature sensing diamond region 3 while the contact regions 10-1 and 10-2 is doped. The measurement was carried out by applying an voltage of 5 to 30 V, e.g. 20 V. The distance between the pair of electrodes 5-1 and 5-2 was chosen 0.3 mm and 0.1 mm. The thermistor constant was measured to be 7000 and 6500 and the activation energies to be 0.6 eV respectively. These thermistors were operative only with voltage application of 10 V and 5 V.

Hereinbelow, description is made for the formation method of the diamond film 2, the laser annealing process and other embodiments.

Figure 2:
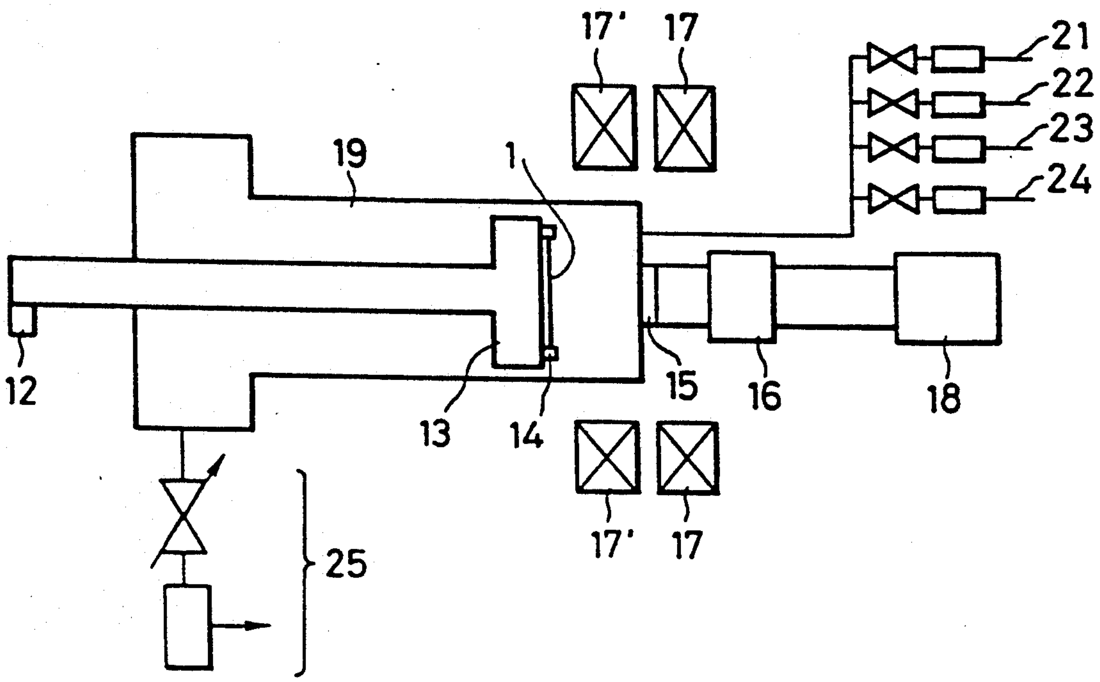
FIG. 2 is a cross sectional view showing a CVD apparatus for use in depositing diamond films as a process of the method in accordance with the present invention.

Referring to FIG. 2, a microwave-assisted CVD apparatus provided with associated Helmholtz coils 17 and 17′ for use in depositing diamond films is shown. The apparatus comprises a vacuum chamber defining a deposition space 19 therein, a microwave generator 18 connected to the chamber through an attenuator 16 and a quartz window 15, a gas introduction system having four inlet ports 21 to 24, a gas evacuation system 25 coupled with the chamber through a pressure controlling valve and a substrate holder 13 provided in the chamber with a substrate position adjusting mechanism 12 for supporting a substrate 1 at an appropriate position. By the use of the adjusting mechanism 12, the axial position of the holder can be adjusted in order to change the volume of the reactive space 19. The evacuation system functions both as a pressure controller and as a stop valve. The pressure in the chamber is adjusted by means of the valve. The inside of the chamber and the holder 13 are circular and coaxial with each other. The procedure of depositing diamond films in the apparatus is as follow.

The substrate 1 is mounted on the holder 13. The surface of the substrate is preferably given scratches in advance which form focuses for crystalline growth. The scratches are formed for example by putting the substrate in a liquid in which diamond fine particles are dispersed and applying ultrasonic waves thereto for 1 minute to 1 hour. After fixing the substrate 1 on the holder 13 with a keeper 14, the pressure in the reaction space 19 is reduced to $10^{-3}$ to $10^{-6}$ Torr by means of the evacuation system 25 followed by introduction of a reactive gas to a pressure of 0.01 to 3 Torr, typically 0.1 to 1 Torr, e.g. 0.26 Torr. The reactive gas comprises —OH bonds, e.g. an alcohol such as methyl alcohol ($CH_3OH$) or ethyl alcohol ($C_2H_5OH$) diluted with hydrogen at a volume ratio of alcohol/hydrogen=0.4 to 2, e.g. 0.7. The hydrogen is introduced through the port 22 at 100 SCCM and the alcohol through the port 21 at 70 SCCM for example. The coils are energized during the deposition to induce a magnetic field having a maximum strength of 2.2 K Gauss and a resonating strength of 875 Gauss at the surface of the substrate 1 to be coated. Then, microwaves are applied at 1 to 5 GHz, e.g. 2.45 GHz up to 10 KW, e.g. 5 KW in the direction parallel to the direction of the magnetic field to cause ionized particles of the reactive gas in the form of plasma to resonate therewith in the magnetic field. As a result, a polycrystalline film of diamond grows on the substrate. 2 hour deposition for example can form a diamond film of 0.5 to 5 micrometers thickness, e.g. 1.3 micrometers thickness. During the deposition of diamond film, carbon graphite is also deposited. However, the graphite, which is relatively chemically unstable as compared with diamond, reacts with radicals which also occur in the plasma of the alcohol and is removed from the deposited film. The temperature of the substrate 1 is elevated to 200° C. to 1000° C., typically 300° C. to 900° C., e.g. 800° C. by microwaves. If the substrate temperature is too elevated, water cooling is effected to the substrate holder 13. If the substrate temperature is too low, the substrate is heated from the holder side by means of a heating means (not shown).

In accordance with preferred embodiments of the present invention, some impurities may be introduced into diamond films during deposition. The introduction of impurity is performed by leaking a dopant gas into the reactive chamber together with a carbon compound gas. For example, in case of S, $H_2S$ or $(CH_3)_2S$ may be introduced as a dopant gas together with the reactive gas at a volume ratio of dopant gas/alcohol=0.001 to 0.03.

Figure 3:
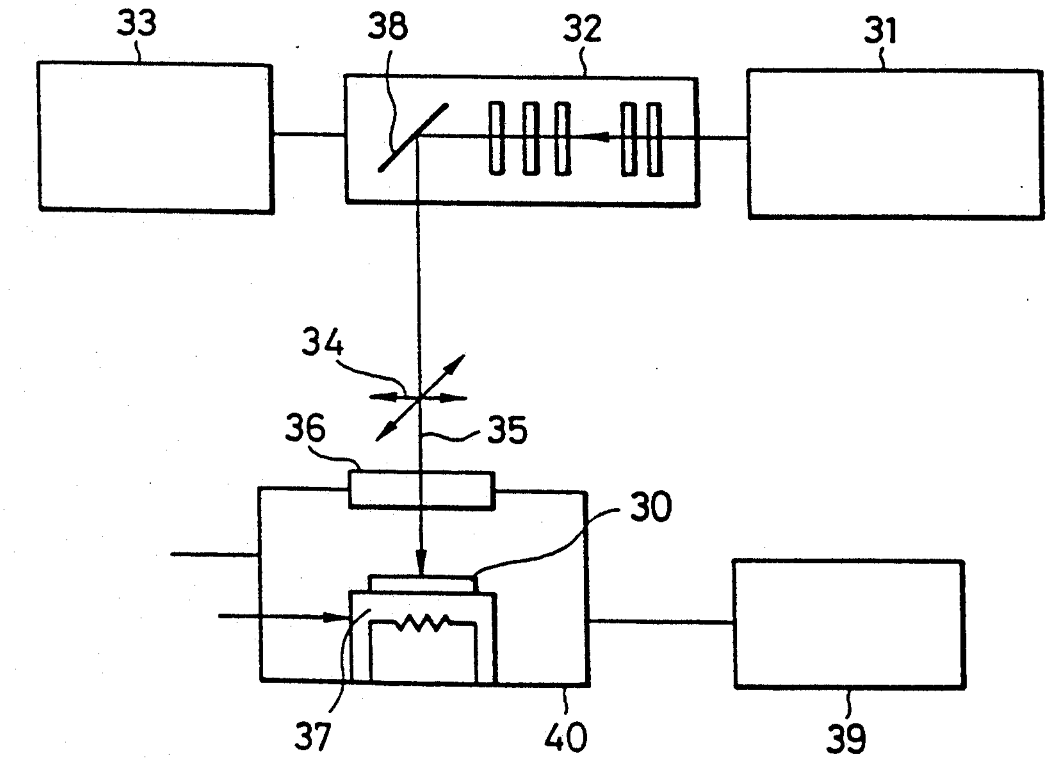
FIG. 3 is a schematic diagram showing a laser annealing apparatus.

The laser annealing in accordance with the present invention is carried out in the following manner. FIG. 3 shows an apparatus for laser annealing. The apparatus comprises a KrF excimer laser 31, an optical system 32, an optical scanning device 33, a vacuum chamber 40 and a turbo molecular pump 39. Substrates 30 coated with diamond films, which have been subjected to ion implantation as described above, are mounted on a substrate holder 37 provided with a heater in the chamber. After evacuating the inside of the chamber to a vacuum of $1\times10^{-6}$ to $1\times10^{-10}$ Torr, the excimer laser 31 is driven to emits laser pulses with an output energy density of 30 to 500 $mJ/cm^2$, e.g. 200 $mJ/cm^2$. The pulse width is no larger than one milisecond, e.g. 5 to 200 nanoseconds, preferably 5 to 50 nanoseconds in order to irradiate the substrate 30 through a quartz window 36. The wavelength is 248 nm (5 eV) in case of the KrF laser. Another laser may be employed which can emit laser light having a wavelength of 100 nm to 500 nm, preferably, no longer than 260 nm equivalent to no lower than 4.8 eV of photon energy. Examples include F, (157 nm). ArF (193 nm) and KrCl (222 nm). The pulse frequency is 0 to 30 pulse per second, e.g. 10 pulses per second. The the laser pulses are shaped into 5 to 10 mm square in cross section by the optical system 32 and deflected upon the mirror 38 controlled by the scanning device 33 to scan the diamond films on the substrates in X and Y directions as shown with arrows 34. The scanning speed is 1 to 5 mm/second on the substrates. During the scanning, the diamond films are not oxidized because of the vacuum. The chamber can be filled, instead of the vacuum, with an inert gas such as He or Ar or hydrogen having 99.99% or higher purity at −197° C. to 700° C. The scanning step may be repeated over the substrates if necessary.

The laser annealing is carried out in a non-equilibrium condition. The diffusion taking place during the laser annealing is signaificantly limited as compared with that during thermal annealing, and therefore the accuracy of the distant between the impurity contact regions can be improved. Since the wavelength of the laser pulses is 248 nm (5 eV of optical energy) which equals the optical energy width of diamond, optical energy absorption into the diamond can be increased. Therefore, a graphite component tranformed from the diamond component by the effect of ion implantation can be cured into diamond. Of course, the corresponding energy of lattice defects is further as small as 2~4 eV so that such defects can be annealed and cured by concentrating energy in a non-equilibrium condition in order to eliminate or decrease groups (clusters) consisting of micronscale defects.

The effect of the laser annealing is four-fold. The ion implantation functions in part to convert diamond (having $sp^3$ bonds) to graphite (having $sp^2$ bonds). The graphite component is undesirable because of its high resistivity. The laser annealing renders the graphite to resume diamond structure. On the other hand, ion implantation causes imperfection of lattice structure due to the existence of dangling bonds. The imperfection, which corresponds to energy of 2 to 4 eV. is cured by the laser annealing. At the same time, lattice distortion takes place during the ion implantation. The laser annealing cures the distortion in the same manner. Furthermore, the impurity introduced into the diamond is made active by the annealing.

Figure 5A:
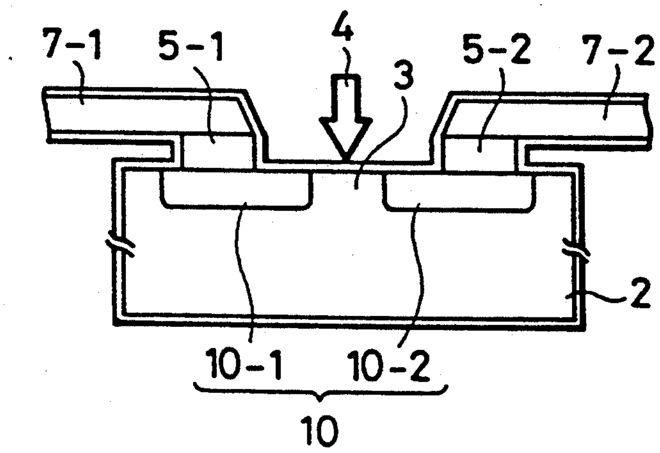
FIGS. 5(A) and 5(B) are cross sectional views showing diamond thermistors in accordance with second and third embodiments of the present invention.

Referring now to FIG. 5(A), a thermistor in accordance with a second embodiment of the present invention is illustrated in cross section. A single crystalline diamond plate 2 is employed as the substrate. A pair of impurity regions 10-1 and 10-2 are formed by ion implantation and laser annealing in the same manner as the first embodiment. A pair of titanium electrodes 5-1 and 5-2 are formed on the impurity regions 10-1 and 10-2. Connection of leads 7-1 and 7-2 is made by welding. The structure is coated with a silicon nitride film in the same manner. The production cost of this embodiment will be much higher than that of the first embodiment. The response speed, however, is expected to be very high because heat can be rapidly transported within the substrate in this case.

Figure 5B:
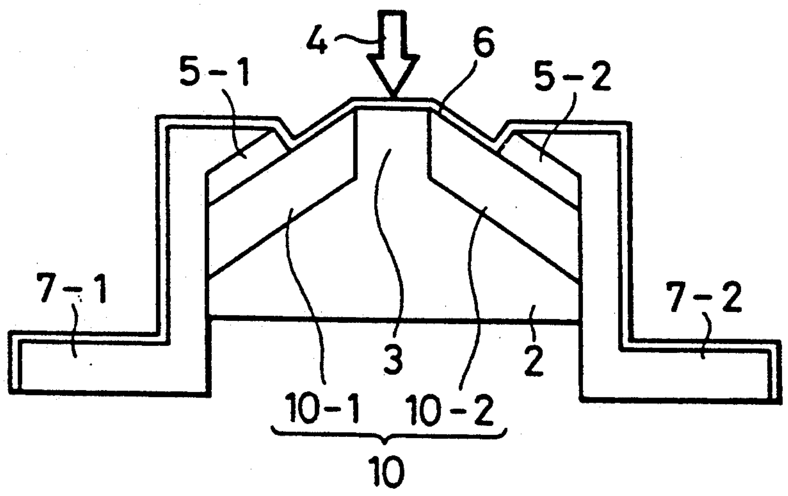

Referring now to FIG. 5(B), a non-planar thermistor in accordance with a third embodiment of the present invention is illustrated in cross section. A plateau is formed on a single silicon carbide substrate by etching away surrounding portions of the substrate. The upper surface of the plateau is formed with slopes to which ion implantation and laser annealing is effected in order to form impurity regions 10-1 and 10-2 in the same manner as the first and second embodiments. Between the impurity regions 10-1 and 10-2 is a temperature sensing region 3. A pair of titanium electrodes 5-1 and 5-2 and leads 7-1 and 7-2 are formed on the impurity regions 10-1 and 10-2 in order that the upper surfaces of the leads and the electrodes do not exceed the upper surface of the sensing region 3. The structure is coated with a silicon nitride film in the same manner. The thermistor of this type is convenient when used in contact temperature sensors.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, the temperature sensing diamond region may be doped with an impurity which is selected from Groups IIb, IVa and VIa of the periodic table but different than that used for the contact diamond regions. Alternatively, after the deposition of the diamond film, an element of Group IIIa such as boron, aluminum or gallium or an element of Group Va such as nitrogen, phosphorus, arsenic or antimony may be introduced therein by ion implantation.

The present invention is broadly applicable for combination usage with other electric devices comprising diamond. These electric devices can be formed on a single substrate, i.e. an integrated circuit device which may consists of diamond light emitting devices, diamond .diodes, diamond transistors, diamond resistances, diamond capacitors and the like. Of course, it is possible to sever a single substrate, after a number of diamond devices are formed on the substrate, into individual separate devices.

What is claimed is:

1. A method of forming an impurity region in a diamond, comprising the steps of:
providing a diamond having a substantially intrinsic conductivity type;
forming, by adding an ionized impurity, an impurity region within said intrinsic diamond.

2. The method of claim 1 wherein the impurity is added by ion implantation and the impurity is selected from Group IIa, IIb, IIa, IVa, Va, or VIa of the Periodic table.

3. The method of claim 1 wherein said diamond film is formed on a silicon substrate.

4. A method of forming an electronic device utilizing diamond comprising the steps of:
preparing a diamond substrate;
adding an ionized impurity to at least a part of said diamond substrate; and
laser annealing said diamond substrate in order to cure damage caused by said addition of an ionized impurity.

5. The method of claim 4 wherein said diamond substrate is substantially intrinsic.

6. The method of claim 4 wherein the impurity is added by ion implantation and the impurity is selected from Group IIa, IIb, IIIa, IVa, Va, or VIa of the Periodic table.

7. The method of claim 4 wherein said laser annealing is carried out with a pulse laser.

8. The method of claim 7 wherein said pulse laser is an excimer laser.

9. The method of claim 4 wherein said laser annealing is carried out in a non-oxidizing atmosphere.

10. The method of claim 4 further comprising the step of forming at least one electrode making electric contact with said at least a part of the diamond substrate added with the impurity.

11. A method of forming an electronic device utilizing diamond comprising the steps of:
forming a diamond film on a substrate;
adding an ionized impurity to at least a part of said diamond film; and
laser annealing said diamond film in order to cure damage caused by said addition of an ionized impurity.

12. The method of claim 11 wherein said diamond film is substantially intrinsic.

13. The method of claim 11 wherein said diamond film is formed on a silicon substrate.

14. The method of claim 11 wherein the impurity is added by ion implantation and the impurity is selected from Group IIa, IIb, IIIa, IVa, or VIa of the Periodic table.

15. The method of claim 11 wherein said diamond film is formed by chemical vapor deposition.

16. The method of claim 11 wherein said laser annealing is carried out with a pulse laser.

17. The method of claim 16 wherein said pulse laser is an excimer laser.

18. The method of claim 11 wherein said laser annealing is carried out in a non-oxidizing atmosphere.

19. The method of claim 11 further comprising the step of forming at least one electrode making electric contact with said at least a part of the diamond film added with the impurity.

20. The method of claim 4 wherein said step of laser annealing is implemented with a laser light having a wavelength from 100 nm to 500 nm.

21. The method of claim 11 wherein a surface of said substrate in contact with said diamond film comprises silicon nitride.

22. The method of claim 11 wherein said step of laser annealing is implemented with a laser light having a wavelength from 100 nm to 500 nm.

* * * * *